(12) United States Patent
Nara et al.

(10) Patent No.: US 8,349,672 B2
(45) Date of Patent: Jan. 8, 2013

(54) DISPLAY ELEMENT MANUFACTURING METHOD AND MANUFACTURING APPARATUS, THIN FILM TRANSISTOR MANUFACTURING METHOD AND MANUFACTURING APPARATUS, AND CIRCUIT FORMING APPARATUS

(75) Inventors: Kei Nara, Yokohama (JP); Tomohide Hamada, Yokohama (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 12/978,779

(22) Filed: Dec. 27, 2010

(65) Prior Publication Data
US 2011/0151630 A1 Jun. 23, 2011

Related U.S. Application Data

(63) Continuation of application No. PCT/JP2009/002749, filed on Jun. 17, 2009.

(30) Foreign Application Priority Data

Jun. 30, 2008 (JP) ................ P2008-169957

(51) Int. Cl.
*H01L 21/00* (2006.01)
*H01L 21/84* (2006.01)
(52) U.S. Cl. .. 438/158; 438/151; 438/159; 257/E21.414
(58) Field of Classification Search ........... 438/158, 438/159, 151; 257/E21.414
See application file for complete search history.

(56) References Cited

U.S. PATENT DOCUMENTS

| 6,582,504 B1 | 6/2003 | Fujita |
| 6,828,582 B1 | 12/2004 | Ando et al. |
| 2003/0059987 A1 | 3/2003 | Sirringhaus et al. |
| 2005/0051780 A1 | 3/2005 | Ando et al. |

FOREIGN PATENT DOCUMENTS

| EP | 1103590 A2 | 5/2001 |
| JP | 2001-155858 A | 6/2001 |
| JP | 2003-518332 A | 6/2003 |
| JP | 2005-79560 A | 3/2005 |
| WO | WO-01/46987 A2 | 6/2001 |
| WO | WO-2008/065977 A1 | 6/2008 |

OTHER PUBLICATIONS

International Search Report dated Sep. 15, 2009 which issued in PCT/JP2009/002749, along with English translation (4 pages).
Written Opinion dated Sep. 15, 2009 which issued in PCT/JP2009/002749, along with English translation (4 pages).

*Primary Examiner* — Jarrett Stark
(74) *Attorney, Agent, or Firm* — Finnegan, Henderson, Farabow, Garrett & Dunner, L.L.P.

(57) ABSTRACT

The thin film transistor manufacturing apparatus comprises a surface modification layer forming means, which forms a surface modification layer on a substrate, an illuminating part, which irradiates light that includes ultraviolet rays, a mask, on which the patterns of the source electrode and the drain electrode are drawn, a projection optical system, which illuminates a mask using light from the illuminating part and projects the pattern of the mask to the substrate as a pattern image, and a coating part, which coats a fluid electrode material to a region in which the surface modification layer has been modified by projection of the pattern image in order to form the source electrode and the drain electrode.

17 Claims, 14 Drawing Sheets

DISPLAY ELEMENT MANUFACTURING METHOD AND MANUFACTURING APPARATUS, THIN FILM TRANSISTOR MANUFACTURING METHOD AND MANUFACTURING APPARATUS, AND CIRCUIT FORMING APPARATUS

CROSS-REFERENCE TO RELATED APPLICATION

This is a Continuation Application of International Application No. PCT/JP2009/002749, filed on Jun. 17, 2009, which claims priority to Japanese Patent Application No. 2008-169957, filed on Jun. 30, 2008, the contents of which are incorporated herein by reference.

BACKGROUND

1. Field of the Invention

The present invention relates to a display element manufacturing method and manufacturing apparatus and a circuit forming apparatus.

2. Description of the Related Art

Widely used as display apparatuses are display media that use liquid crystals or organic EL, etc. In addition, in such display media, technology that uses active drive elements comprised of thin film transistors (TFT) as pixel drive elements in order to ensure uniformity of screen illumination intensity and screen rewriting speed is becoming the mainstream.

In recent years, in order to pursue cost reductions of active drive elements, as disclosed in Japanese Unexamined Patent Application Publication No. 2005-079560, research and development on thin film transistors that use organic semiconductor materials has been vigorously progressing. Because these thin film transistors can be manufactured in a low-temperature process, it is possible to use resin substrates that are light and tend to crack, and it is said that flexible display apparatuses that use resin film can be achieved. In addition, by using organic semiconductor materials, which can be manufactured by a wet processes such as printing or coating under atmospheric pressure, there is the possibility of being able to achieve display apparatuses that are excellent in terms of producability and are extremely low in cost. In this Patent Document 1, liquid crystal display elements are disclosed as display apparatuses that use thin film transistors. In addition, Japanese Unexamined Patent Application Publication No. 2001-155858 discloses an organic EL element manufacturing method resulting from a similar printing method.

In general, the response performance of thin-film transistors (TFT) is such that the length of the channel length between the source electrode and the drain electrode is important. As disclosed in Japanese Unexamined Patent Application Publication No. 2005-079560, adequate resolution cannot be achieved in systems that merely irradiate light to perform exposure. In addition, display apparatuses are becoming larger, and substrates are becoming larger. When substrates become larger, masks must also become larger, and large increases in the cost of mask manufacture become a problem.

SUMMARY

Aspects of the present invention provide a display element manufacturing method or manufacturing apparatus that accurately forms the source electrode and the drain electrode without using a resist is provided.

A display element manufacturing method according to an aspect of the present invention comprises a process that forms a first surface modification layer on a substrate, a process that, by using a mask and a projection optical system to irradiate light that includes ultraviolet rays to the first surface modification layer, transfers the pattern of the mask to the first surface modification layer, and a pattern forming process that forms the pattern on a region in which the first surface modification layer has been modified by transfer of the pattern.

A display element manufacturing apparatus according to an aspect of the present invention comprises a layer forming part of surface modification layer, which forms a surface modification layer on a substrate, an illuminating part, which irradiates light that includes ultraviolet rays, a projection optical system, which illuminates a mask on which a pattern has been drawn with light from the illuminating part and projects the pattern of the mask to the substrate as a pattern image, and a pattern forming part, which forms the pattern on a region in which the surface modification layer has been modified by projection of the pattern.

A circuit forming apparatus according to an aspect of the present invention comprises a transporting part, which transports a flexible substrate in a prescribed direction, an illumination optical system, which supplies illumination light to a mask on which a prescribed pattern has been drawn, a projection optical system, which projects the pattern of the mask to an exposure region on the substrate as a pattern image in order to form a circuit on the flexible substrate, a support apparatus, which supports the flexible substrate corresponding to the exposure region of the projection optical system, and a substrate retaining apparatus, which slackens the flexible substrate provided at upstream side and downstream of the support apparatus in the prescribed direction.

A thin film transistor manufacturing method according to an aspect of the present invention comprises a process that forms a gate electrode on a substrate, a process that forms an insulating layer on the gate electrode, a process that forms a first surface modification layer on the surface of the insulating layer, a process that, by using a mask and a projection optical system to irradiate light that includes ultraviolet rays to the first surface modification layer, transfers the patterns of a source electrode and a drain electrode of the mask to the first surface modification layer, a process that, in a region in which the first surface modification layer has been modified by transfer of the pattern, coats a fluid electrode material and forms the source electrode and the drain electrode, and a process that forms an organic semiconductor layer between the source electrode and the drain electrode.

A thin film transistor manufacturing apparatus according to an aspect of the present invention comprises a layer forming part of surface modification layer, which forms a surface modification layer on a substrate, an illuminating part, which irradiates light that includes ultraviolet rays, a mask, on which the patterns of the source electrode and the drain electrode have been drawn, a projection optical system, which illuminates the mask with light from the illuminating part and projects the pattern of the mask to the substrate as a pattern image, and a coating part, which coats a fluid electrode material to a region in which the surface modification layer has been modified by projection of the pattern in order to form the source electrode and the drain electrode.

According to aspects of the present invention, it is possible to provide a display element manufacturing method or manufacturing apparatus that accurately forms the source electrode and the drain electrode without using a resist is provided.

DESCRIPTION

Thin Film Transistor Manufacturing Method

Figure 1:
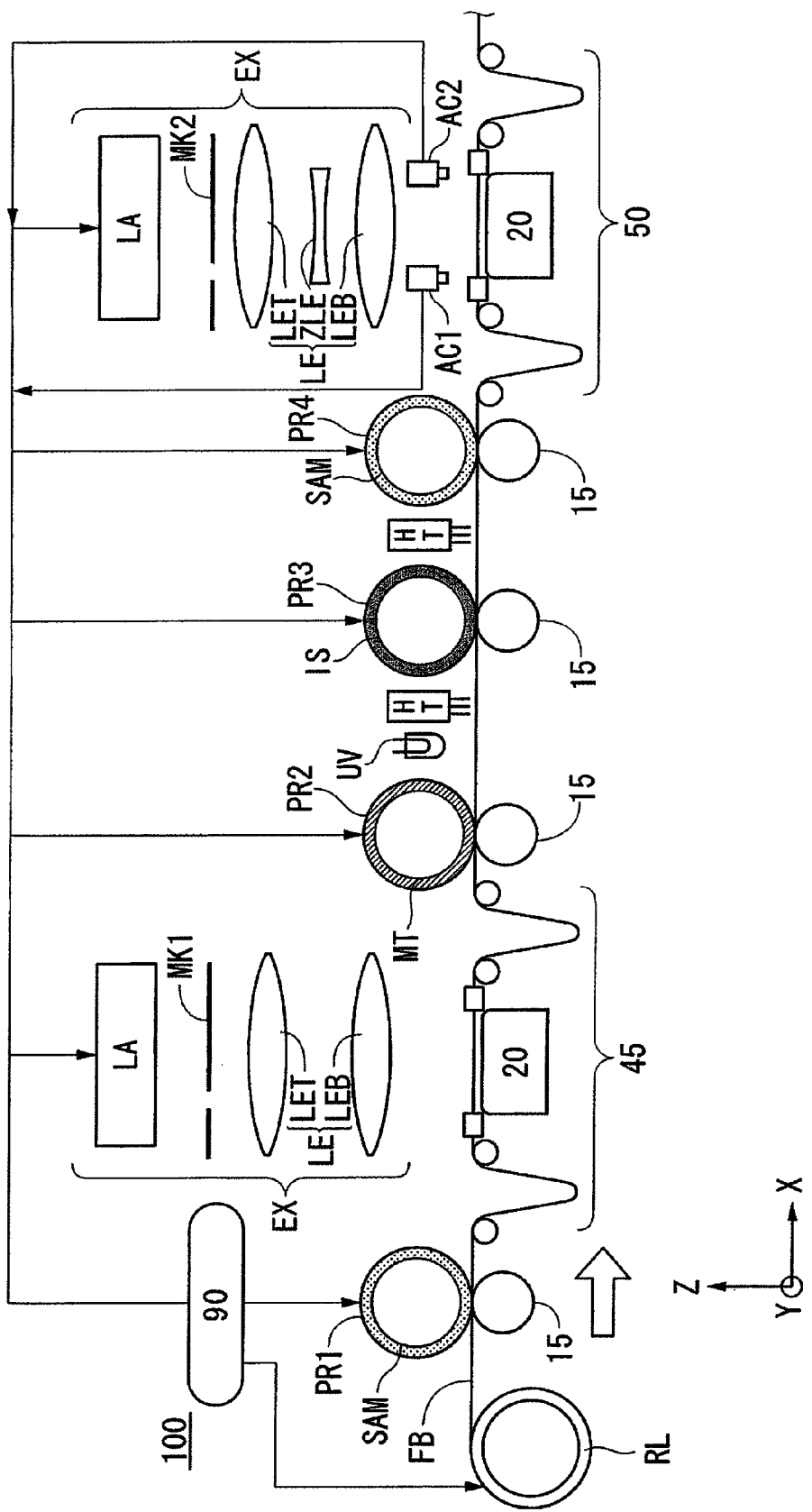
FIG. 1 is an explanatory view that describes an example of a manufacturing apparatus of a thin film transistor.

FIG. 1 is an explanatory view that describes an example of a manufacturing apparatus 100 of a thin film transistor TFT of the present embodiment. In the first process of the thin film transistor TFT manufacturing method, a surface modification layer SAM is formed on a substrate FB.

The manufacturing apparatus 100 of the thin film transistor TFT comprises a supply roll RL for feeding a flexible sheet substrate FB that has been wound into a roll shape. By means of the supply roll RL rotating at a prescribed speed, the sheet substrate FB is fed in the direction of the arrow (X axis direction), which is the transport direction. Herein, a flexible sheet substrate is arbitrarily called a substrate.

The substrate FB used in the present embodiment is a heat resistant resin film, and, specifically, it is possible to use one that is a polyethylene resin, a polypropylene resin, a polyester resin, an ethylene vinyl copolymer resin, a polyvinyl chloride resin, a cellulose resin, a polyamide resin, a polyimide resin, a polycarbonate resin, a polystyrene resin or a vinyl acetate resin and that has a light transmission function. In addition, the substrate FB is such that it is possible to reduce the thermal expansion coefficient by mixing an inorganic filler into the resin film so that the dimensions do not change even if subjected to heat. Examples of the inorganic filler are titanium oxide, zinc oxide, alumina, silicon oxide, etc.

As shown in FIG. 1, this surface modification layer SAM is coated onto the substrate FB by means of an offset printing method, etc. in a status in which soaking into a printing roller PR1 (a layer forming part of surface modification layer) has been performed. The coating process of this surface modification layer SAM will be described later using FIG. 3.

In the next process, an exposure apparatus EX (a pattern forming part) exposes the pattern of the gate electrode mask MK1 onto the substrate FB. Note that a transport apparatus 45, which transports the substrate FB in the exposure apparatus EX, is different from a transporting part 50 to be discussed below on the point that it does not have an alignment camera AC.

The exposure apparatus EX irradiates ultraviolet light (light that includes ultraviolet rays) from an illumination apparatus LA (an illuminating part, an illumination optical system). The ultraviolet light that has passed through the gate electrode mask MK1 is projected to the substrate FB using a projection optical system LE. The exposure process resulting from this exposure apparatus EX will be described below using FIG. 4.

When the gate electrode pattern of the mask MK1 is exposed onto the surface modification layer SAM for the substrate FB, the surface modification layer SAM sublimates. Through this, the wiring pattern of the gate electrode is formed on the substrate FB. In addition, the patterns of alignment marks are also formed on the mask MK1 for positional control of the substrate FB, and the alignment marks are formed during exposure. Note that in the case in which alignment marks are not formed on the substrate FB by means of exposure, a substrate FB on which alignment marks have already been formed may be made available.

In the next process, a printing roller PR2 (a coating part) coats a fluid electrode material MT to the gate electrode wiring pattern.

The fluid electrode material MT is soaked into a printing roller PR2. A rotating roller 15 is arranged at the side opposite the printing roller PR2 that has interposed the substrate FB. By means of the printing roller PR2 and the rotating roller 15 rotating, the substrate FB is fed in the direction of the arrow. The printing process of this fluid electrode material MT will be discussed later using FIG. 5.

In the next process, an ultraviolet ray light source UV irradiates light that includes ultraviolet rays to the remaining surface modification layer SAM. Through this, the entire surface modification layer SAM on the substrate FB is sublimated. Next, a hot air heater HT sprays hot air of approximately 200° C. onto the substrate FB and bakes the fluid electrode material MT. Through this, the gate electrode GT is dried.

In the next process, an insulator IS layer is formed on the substrate FB by means of an offset printing method, etc. resulting from a printing roller PR3 (a coating part). This insulator IS is dried using, for example, the hot air heater HT.

Next, a surface modification layer SAM is again coated onto the substrate FB by means of an offset printing method, etc. resulting from a printing roller PR4 (a layer forming part of surface modification layer). Printing roller PR4 causes soaking in of the surface modification layer SAM. The coating process of this insulator IS and surface modification layer SAM will be discussed later using FIG. 6.

In the next process, the exposure apparatus EX exposes the pattern of the source electrode and drain electrode mask MK2 onto the substrate FB. A transporting part 50 prepared in the exposure apparatus EX will be described using FIG. 2.

The exposure apparatus EX irradiates ultraviolet light from an illumination apparatus LA. The ultraviolet light that has passed through the source electrode and drain electrode mask MK2 is projected to the substrate FB by means of a projection optical system LE. In particular, the channel length, which is the distance between the source electrode and the drain electrode, determines the performance of the thin film transistor TFT.

In addition, the projection optical system LE has a magnification lens ZLE that performs magnification and adjustment. The magnification lens ZLE is able to enlarge and reduce the wiring pattern of the source electrode and drain electrode mask MK2 to match the size of the gate electrode, etc. Exposure of the source electrode and the drain electrode will be discussed later using FIG. 7.

Though not shown in FIG. 1, a process for forming an organic semiconductor OG layer is continued after processes for forming the source electrode, the drain electrode, etc. These processes will be discussed later using FIGS. 8A and 8B.

Returning to FIG. 1, the manufacturing apparatus 100 of the thin film transistor TFT has a transport control part 90. The transport control part 90 performs speed control of the supply roll RL and printing rollers PR1 through PR4. In addition, the transport control part 90 receives the results of detection of the alignment marks AM from a plurality of alignment cameras AC (AC1, AC2) and controls, for example, the exposure timing of the exposure apparatus EX.

(Substrate Transport Apparatus)

Figure 2:
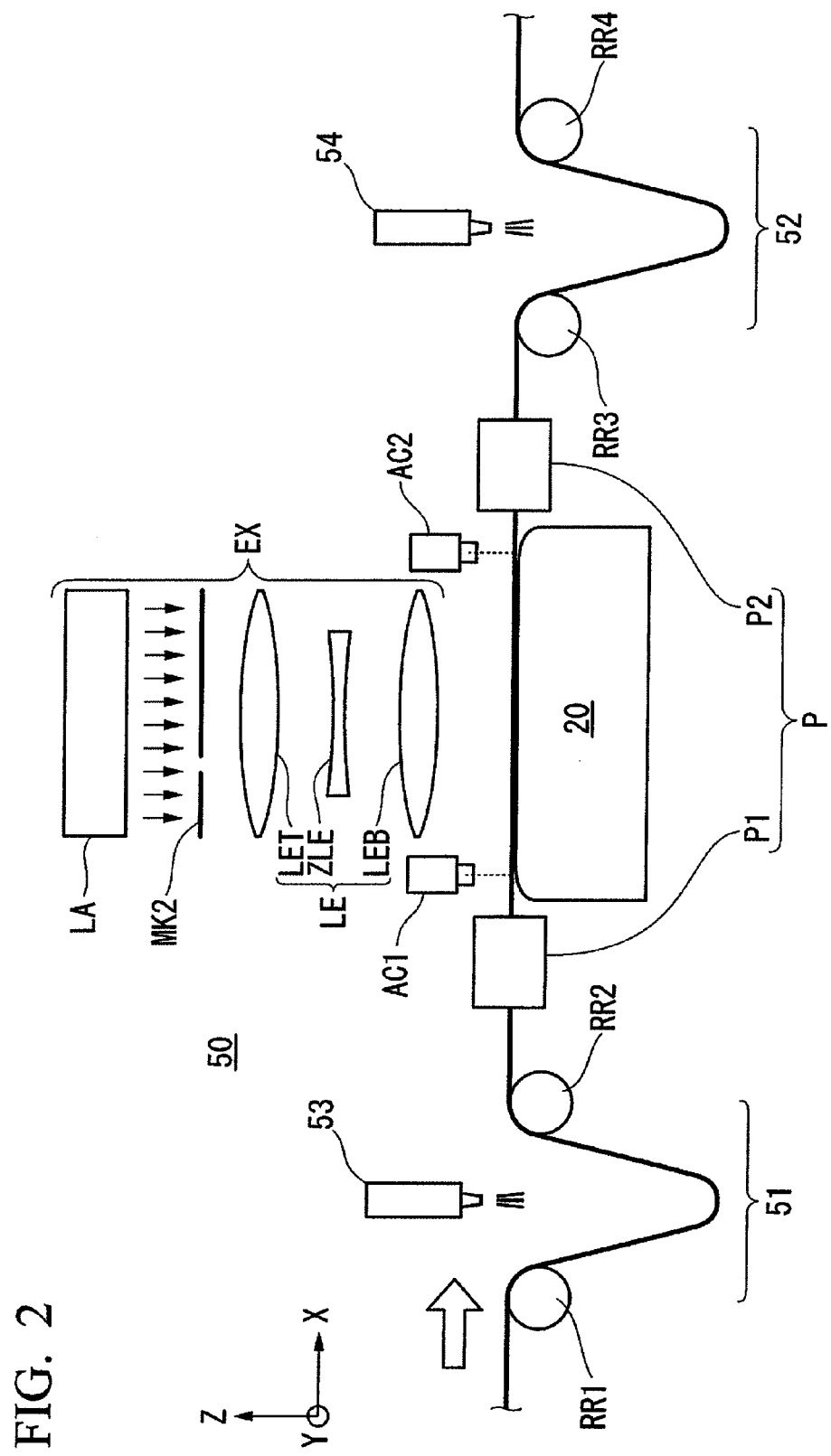
FIG. 2 is a schematic side view of a transporting part as seen from the Y axis directions with respect to the transport direction.

FIG. 2 is a schematic side view of the exposure apparatus EX, which uses the source electrode and drain electrode mask MK2, and the transporting part 50 as seen from the Y axis direction (the side).

In the manufacturing apparatus 100 of the element, the transport apparatus and the transport method of the substrate FB in exposure processing, which affect the performance of the element, have a particularly large effect on product yield and cost reduction. The transport apparatus and the transport method of the substrate FB will be described below.

The transporting part 50 is provided with a first sheet retaining part 51 (a first sheet retaining apparatus) and a second sheet retaining part 52 (a second sheet retaining apparatus) backward and forward in the exposure apparatus EX in the transport direction (+X axis direction) of the substrate FB, and a planar holding stage 20 (a support apparatus) is provided between the first sheet retaining part 51 and the second sheet retaining part 52. The planar holding stage 20 causes the substrate FB to float up by a fixed distance using a gas such as air to support the substrate FB. The transporting part 50 is provided with an elastic deforming part P (first elastic deforming part P1, second elastic deforming part P2) backward and forward in the planar holding stage 20 in the transport direction of the substrate FB. Then, the first elastic deforming part P1 and the second elastic deforming part P2 move and deform the substrate FB. The transporting part 50 is provided with an alignment camera AC1 and an alignment camera AC2 backward and forward in the planar holding stage 20 in the transport direction of the substrate FB. The alignment camera AC1 and the alignment camera AC2 are installed between the first elastic deforming part P1 and the second elastic deforming part P2. In addition, the alignment camera AC1 and the alignment camera AC2 are installed on the upper side (+Z side) of the substrate FB. Alignment camera AC1 and alignment camera AC2 calculate the position and amount of deformation of the substrate F13 by detecting the alignment marks AM of the substrate FB. The first sheet retaining part 51 is provided between a first moving roller RR1 and a second moving roller RR2. In addition, the second sheet retaining part 52 is provided between a third moving roller RR3 and a fourth moving roller RR4. The flexible substrate FB is suspended downward (−Z direction) by its own weight by means of the first sheet retaining part 51 and the second sheet retaining part 52 and comes to have a downward protruding shape. The transporting part 50 may also comprise a first air jetting part 53 and a second air jetting part 54 facing the sheet retaining lowermost part in order to facilitate forming of the first sheet retaining part 51 and the second sheet retaining part 52. The first air jetting part 53 and the second air jetting part 54 are able to cause the substrate to be suspended downward while having an appropriate tension (tensional force) by blowing compressed air to the substrate FB.

The transporting part 50 forms a buffer region for temporarily stopping the substrate at the planar holding stage 20 by means of providing the first sheet retaining part 51 and the second sheet retaining part 52. The exposure apparatus EX needs to temporarily stop the substrate FB in order to expose the wiring pattern of the source electrode and the drain electrode of the mask MK2 onto the substrate. On the other hand, from printing roller PR1 through printing roller PR4 shown in FIG. 1 rotation, and the substrate FB comes to be sent to the exposure apparatus EX. In this way, the first sheet retaining part 51 is able to store the substrate FB that comes to be transported even in a status in which transporting of the substrate FB is stopped by the planar holding stage 20. Namely, a convex portion (sag portion) of the first sheet retaining part 51 further hangs down (moves downward) (−Z direction) due to the transporting of the substrate FB, then the substrate FB is retained which has more longer length between the first moving roller RR1 and the second moving roller RR2.

After the exposure apparatus EX has exposed the wiring pattern of the mask MK2 on the substrate FB, the substrate F13 is promptly transported from the planar holding stage 20. For this reason, the substrate FB must be transported from the planar holding stage 20 at a velocity faster than the transport velocities of the substrate FB from printing roller PR1 through printing roller PR4 shown in FIG. 1. At this time, the second sheet retaining part 52 takes in the substrate FB that has come to be sent at a high velocity. For example, a convex portion (sag portion) of the second sheet retaining part 52 further hangs down (moves downward) (−Z direction) due to the transporting of the substrate FB, then the substrate FB is retained which has more longer length between the third moving roller RR3 and the fourth moving roller RR4. In addition, it is also possible to use so-called scanning exposure in which the exposure region is slit-shaped without being limited to the aforementioned full-field stationary exposure. Even in the case in which precision scanning exposure is performed at a relatively low speed with respect to a substrate FB transported at a high velocity, sheet retaining is effective to obtain the above-mentioned result. In this way, the velocity of the substrate FB when the exposure apparatus EX performs scanning exposure and the transport velocity of the substrate FB may be different velocities. In the above way, the transporting part 50 is able to prevent excessive tension from being generated on the substrate FB outside the range between the first elastic deforming part P1 and the second elastic deforming part P2 by forming sheet retaining and avoids fracturing or warping occurring.

Thin Film Transistor and Organic Element Manufacturing Method

From FIG. 3 through FIG. 9B are explanatory drawings that describe an example of the manufacturing method of the thin film transistor TFT and the organic EL element of the present embodiment. In addition, FIG. 3 through FIG. 7 are drawings that show the respective processes shown in FIG. 1 in detail.

Figure 3A:
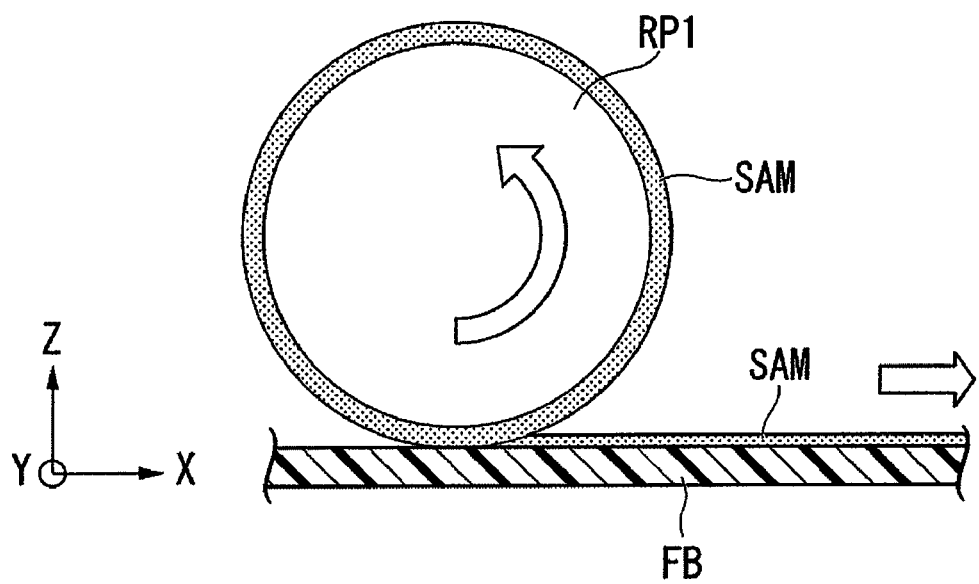
FIG. 3A is a schematic cross-sectional view of when a substrate is manufactured.
Figure 3B:
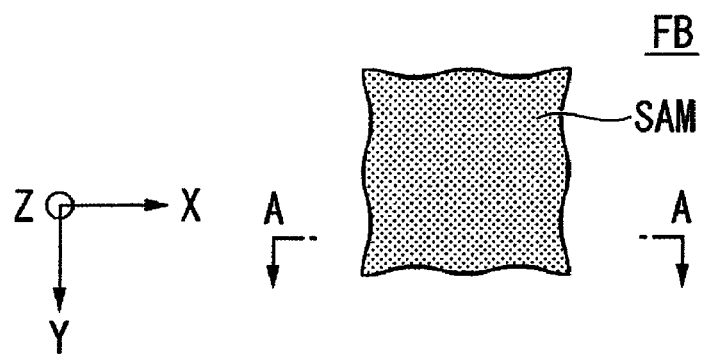
FIG. 3B is a plan view of the substrate as seen from the upper surface, and the A-A cross-section shows a part of FIG. 3A.

FIG. 3A is a schematic cross-sectional view of when the substrate FB is manufactured. FIG. 3B is a plan view of the substrate FB as seen from the upper surface (+Z direction), and the A-A cross-section thereof shows a part of FIG. 3A.

In FIG. 3, the surface modification layer SAM is formed on the substrate FB. The substrate FB is such that the material is not particularly limited. For example, it is possible to use an insulating material such as glass or a flexible resin sheet. These may be not only transparent materials but opaque materials as well. The surface modification layer SAM is formed on that substrate FB. In the embodiment below, a description will be given premised upon a resin sheet in which the width of the substrate FB is several meters and the length is several hundred meters and it is managed (stocked) in roll shape before the supply roll RL supplies it.

The surface modification layer SAM is a layer that has the property of repelling the electrode material that becomes the gate electrode (the property of not fastening or shedding the electrode material on the surface of itself, repellency or low affinity with respect to the electrode material), the source electrode or the drain electrode. The surface modification layer SAM is a self-assembled monolayer (SAM), for example, a solution in which octadecyltrichlorosilane has been dissolved in 0.1 mol/l of toluene. As shown in FIG. 3A, this surface modification layer SAM is coated onto the substrate FB by an offset printing method, etc. in a status in which soaking into the printing roller PR1 has been performed. In addition to the offset printing method, it may also be a screen printing method. In addition, coating by the droplet spraying method, which uses an inkjet, the spin coating method, which forms a thin film using centrifugal force, the dipping method, which soaks the substrate FB in a solution, or the mist deposition method are also possible. The mist deposition method is a method that makes the liquid material into tiny droplets by using a spray nozzle or ultrasonic waves and feeds an aggregate of those droplets onto the substrate to accumulate a thin film.

Otherwise, the surface modification layer SAM may be any material as long as it is one that sublimates by means of light that includes ultraviolet light (hereunder, referred to as ultraviolet light) at a layer that has the property of repelling the electrode material. Examples are monoalkyltrichlorosilane, octadecyltrimethoxysilane and hexamethyl disilazane octyltrichlorosilane. In addition, the surface modification layer SAM improves the orientation of the organic semiconductor OG as discussed above to improve switching performance of the element.

Figure 4A:
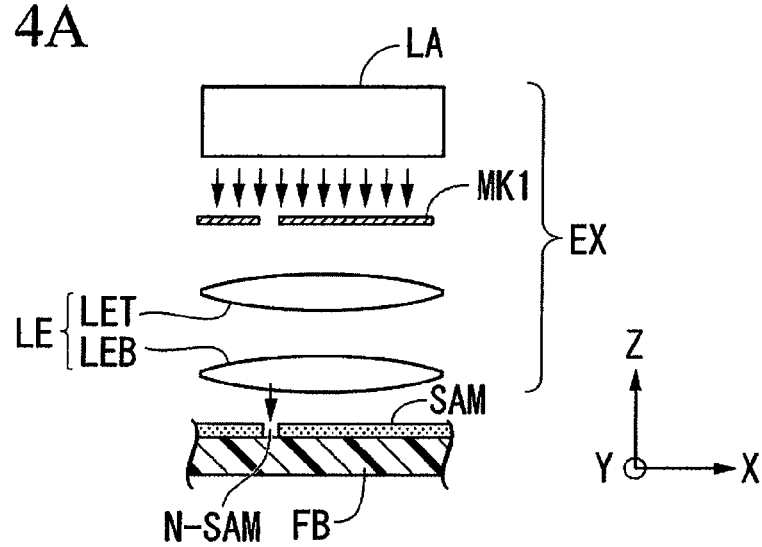
FIG. 4A is a drawing that shows a schematic view of the exposure apparatus and a cross-sectional view of the substrate.
Figure 4B:
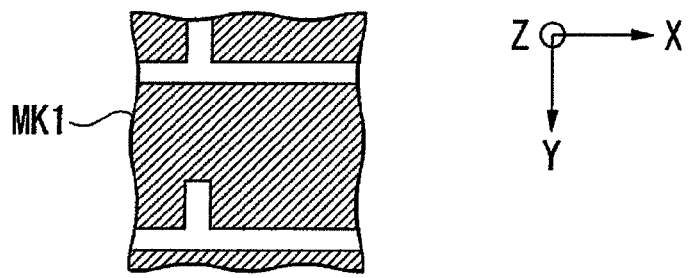
FIG. 4B is a plan view in which a mask used in the exposure apparatus has been drawn.
Figure 4C:
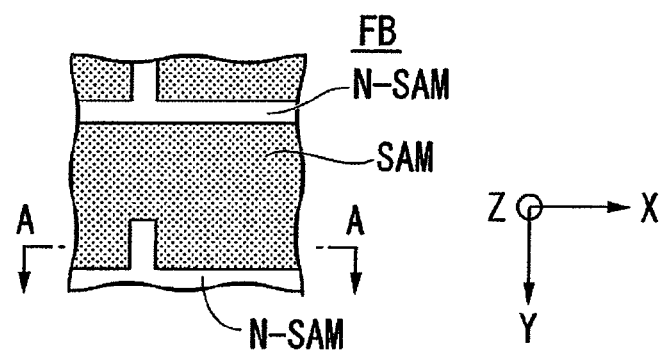
FIG. 4C is a plan view of the substrate after exposure has been performed as in FIG. 4A.

FIG. 4A is a drawing that shows a schematic view of the exposure apparatus EX and a cross sectional view of a substrate FB. FIG. 4B is a plan view in which the mask MK1 used in the exposure apparatus EX is drawn. FIG. 4C is a plan view of the substrate FB after exposure has been performed by the exposure apparatus EX in FIG. 4A. The A-A cross-section thereof is a cross-sectional view of the substrate FB of A.

As shown in FIG. 4B, a gate electrode mask MK1 is prepared with respect to the exposure apparatus EX shown in FIG. 4A. The mask MK1 is a mask in which a chrome layer for shielding is formed on, for example, quartz glass.

The exposure apparatus EX irradiates ultraviolet light from the illumination apparatus LA. The ultraviolet light that has passed through the gate electrode mask MK1 is projected to the substrate FB by the projection optical system LE. It is preferable that the projection optical system LE be object side telecentric in the space from the gate electrode mask MK1 to a first lens LET of the upper end of the projection optical system LE. When it is object side telecentric, even if the distance between the gate electrode mask MK1 and the first lens LET becomes greater, and the gate electrode mask MK1 becomes tilted, the shape of the pattern image of the gate electrode does not change. In addition, it is preferable that the projection optical system LE be image side telecentric in the space from a second lens LEB of the lower end of the projection optical system LE to the substrate FB. When it is image side telecentric, even if the projection optical system LE has had a fluctuation in the focus position due to changes in atmospheric pressure and atmospheric temperature, and the thickness of the surface modification layer SAM that has been coated onto the substrate FB fluctuates, the pattern of the gate electrode will hardly change at all. In addition, even if the substrate FB is tilted, there is little shape change in pattern image of the gate electrode.

When the ultraviolet light reaches the surface modification layer SAM, the surface modification layer SAM sublimates. For this reason, as shown in FIG. 4C, a region (SAM), in which the surface modification layer SAM is coated on the substrate FB, and a sublimated region (N-SAM) are formed, and the pattern of the mask MK1 is transferred onto the substrate FB.

Figure 5A:
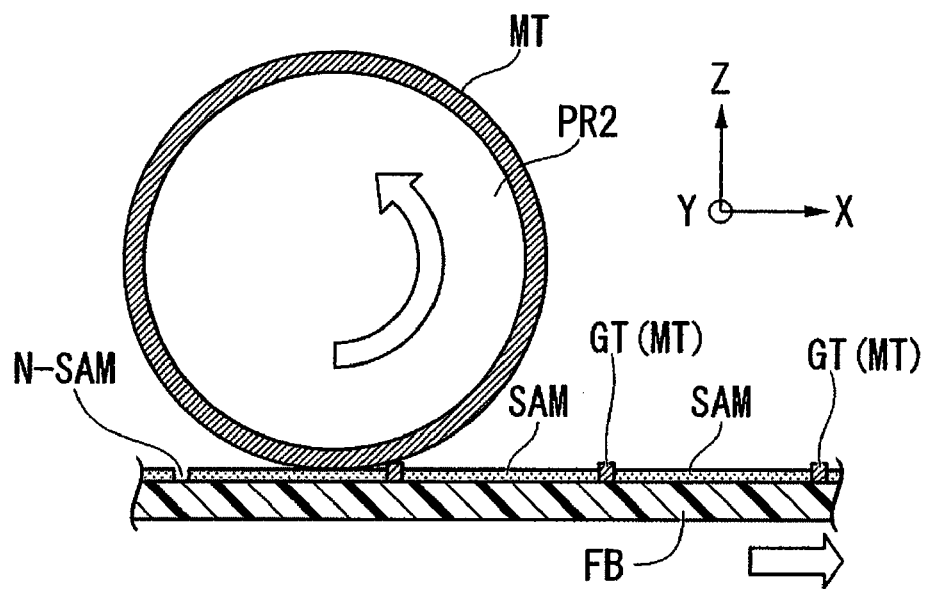
FIG. 5A is a drawing that shows a schematic view that shows the formation process of the gate electrode and a cross-sectional view of the substrate.
Figure 5B:
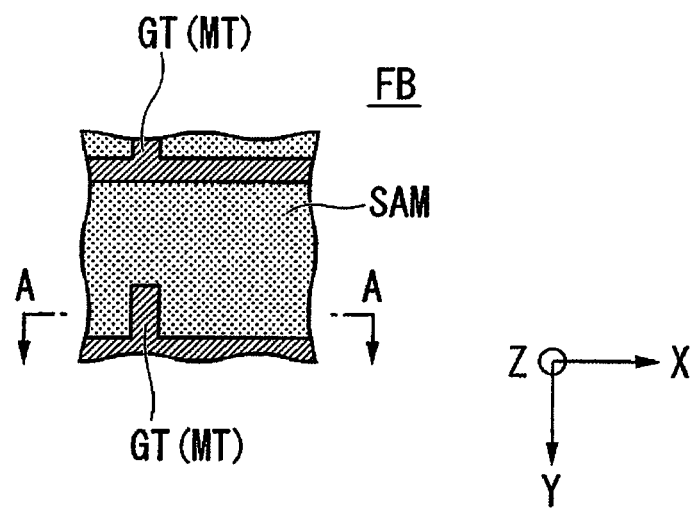
FIG. 5B is a plan view of the substrate in which the gate electrode has been formed.

FIG. 5A is a schematic view in which the gate electrode GT forming process is shown, and a cross-sectional view of the substrate FB is also shown. In addition, FIG. 5B is a plan view of the substrate FB formed by the gate electrode GT, and the A-A cross section thereof is a part of the cross-sectional view of the substrate FB of FIG. 5A.

As shown in FIG. 5A, by means of the printing roller PR2, which is in a status in which a fluid electrode material MT has been soaked into the printing roller PR2, rotating and the substrate FB being fed by means of a substrate moving roller that is not shown, the fluid electrode material MT is coated onto the substrate FB. In addition to a printing method such as offset printing, the fluid electrode material MT may also be coated by the droplet spraying method, the spin coating method, the dipping method or the mist deposition method. The fluid electrode material MT does not adhere to the region (SAM) on which the surface modification layer SAM has been coated, and the fluid electrode material MT, which has been caused to soak into the printing roller PR2, adheres to the region (N-SAM) in which the surface modification layer SAM has been sublimated, and the pre-drying gate electrode GT (MT) shown in FIGS. 5A and 5B is formed.

A water dispersible conductive polymer is used as the fluid electrode material MT. Examples of the conductive polymer are polyaniline (PANI) and polyethylene dioxythiophene into which polystyrene sulfonate has been doped (PEDOT/PSS). In addition, the fluid electrode material 21 may be a solution that includes metal particles, and it is not particularly limited as long as it is a metal that is able to particlize and disperse in a solvent, such as platinum (Pt), gold (Au), silver (Ag), copper (Cu) and nickel (Ni).

Figure 6:
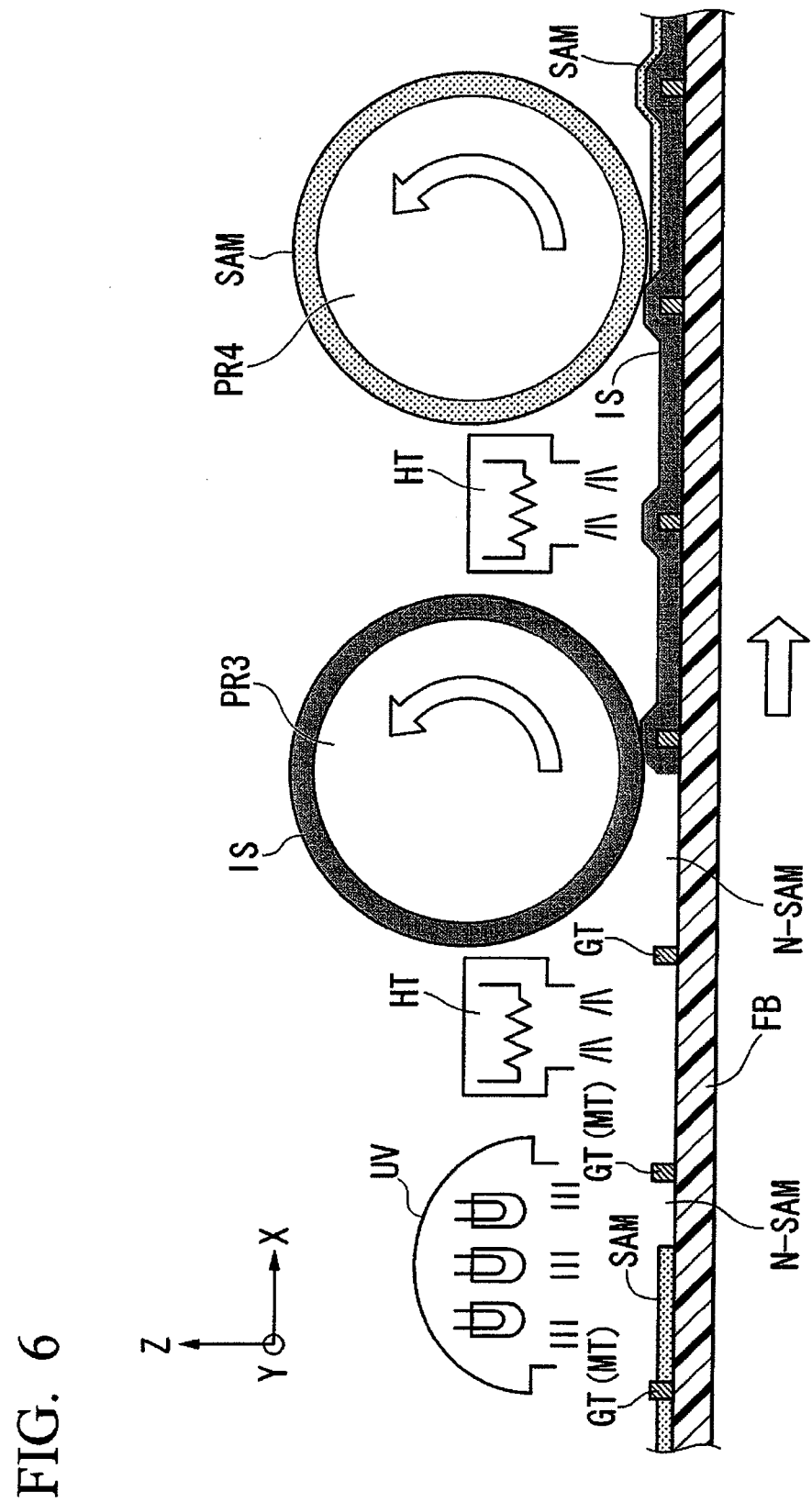
FIG. 6 is drawing that shows a schematic view in which a process in which an insulating layer and a surface modification layer are formed after the gate electrode has been formed and a cross-sectional view of the substrate.

FIG. 6 is a schematic view that shows a process in which an insulating layer IS (the insulator IS layer) and the surface modification layer SAM are formed after a pre-drying gate electrode GT (MT) is formed, and a cross-sectional view of the substrate FB is also shown.

As shown at the leftmost side of FIG. 6, a surface modification layer SAM remains on the substrate FB around the gate electrode GT. For this reason, the ultraviolet ray source UV irradiates ultraviolet rays, and the remaining surface modification layer SAM is entirely sublimated. Then, a region (N-SAM) in which the surface modification layer SAM has been sublimated results around the gate electrode GT.

Next, the hot air heater HT, etc. is used to spray hot air of approximately 200° C., and the pre-drying gate electrode GT (MT) is baked. Through this, the gate electrode GT is completed. Note that the sublimation of the surface modification layer SAM by means of ultraviolet rays and the baking of the pre-drying gate electrode GT (MT) may also be performed in the reverse order.

The next the printing roller PR3 is in a status in which the insulator IS has been soaked in. The layer of the insulator IS is formed on the substrate FB by means of an offset printing method, etc. resulting from this the printing roller PR3. The insulator IS may also be coated by the droplet spraying method or the mist deposition method, etc. Resin material such as polyimide, acrylic, polyvinyl alcohol (PVA) or polymethyl methacrylate (PMMA) are used as the insulator IS. This insulator IS is dried using the hot air heater HT, etc. Next, as shown at the rightmost side of FIG. 6, the surface modification layer SAM is again coated onto the insulator IS layer by the offset printing method, etc.

Figure 7A:
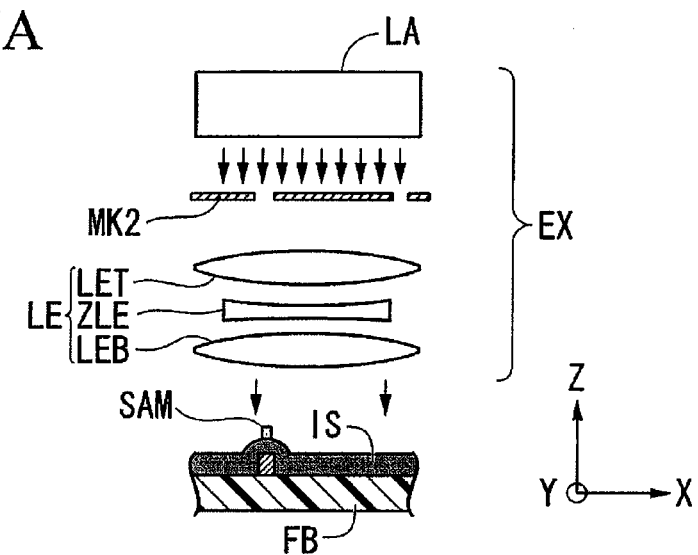
FIG. 7A is a drawing that shows a schematic view of the exposure apparatus and a cross-sectional view of the substrate.
Figure 7B:
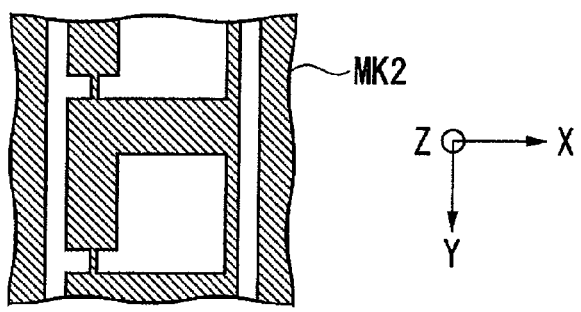
FIG. 7B is a plan view in which a source electrode and drain electrode mask has been drawn.
Figure 7C:
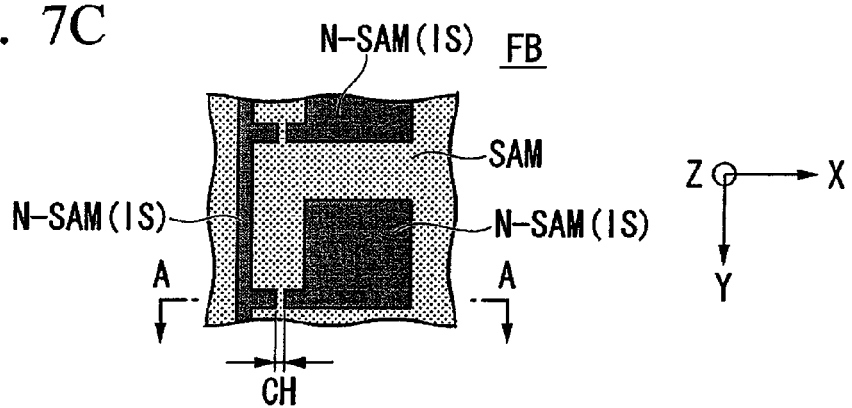
FIG. 7C is a plan view of the substrate after exposure has been performed.

Similarly to FIG. 4A, FIG. 7A is a drawing that shows a cross-sectional view of the substrate FB along with a schematic view of the exposure apparatus EX. In addition, FIG. 7B is a plan view in which the source electrode and drain electrode mask MK2 is drawn. FIG. 7C is a plan view of the substrate FB after exposure has been performed. The A-A cross-section of FIG. 7C is a cross-sectional view of the substrate FB of 7A.

A source electrode, drain electrode and pixel electrode mask MK2 such as that shown in FIG. 7B is prepared with respect to the exposure apparatus EX shown in FIG. 7A. This mask MK2 is one that can be also be used for the pixel electrode, which becomes the light emitting region, but for convenience it is called the source electrode and drain electrode mask MK2.

The exposure apparatus EX irradiates ultraviolet light from the illumination apparatus LA. The ultraviolet light that has passed through the source electrode and drain electrode mask MK2 is projected to the substrate FB by the projection optical system LE. It is preferable that the projection optical system LE be object side telecentric in the space from the source electrode and drain electrode mask MK2 to the first lens LET of the upper end of the projection optical system LE. In addition, it is preferable that it be image side telecentric in the space from the second lens LEB of the lower end of the projection optical system LE to the substrate FB.

In particular, the channel length CH, which is the distance between the source electrode and the drain electrode, determines the performance of the thin film transistor TFT. It is preferable that the channel length CH between a source electrode SO and a drain electrode DR (see FIGS. 8A and 8B) be a width that is less than or equal to approximately 5 µm. In order to reliably perform exposure at this line width, it is preferable that the exposure apparatus EX use ultraviolet light of a wavelength shorter than that of i rays (365 nm), and it is also preferable that the numerical aperture NA of the projection optical system LE be 0.05 or higher. In addition, due to the gate electrode GT or the insulator IS, the surface height of the substrate FB varies or the width of the substrate FB is wide, so it is preferable that the projection optical system LE be image side (substrate FB side) telecentric, and, it is more preferable that it be double telecentric. In addition, the reason that it is preferable that it be double telecentric is as follows. In proximity exposure, which does not use a projection optical system, resolution is poor, and it is difficult to make the channel length CH approximately 5 µm or less. In addition, in contact exposure, which causes the mask to directly touch the substrate, defects tend to occur easily. In addition, in a back exposure, which irradiates ultraviolet rays from the rear side of the substrate FB in order to sublimate the surface modification layer SAM, it is necessary for the substrate and the layer below the surface modification layer to be a material that transmits ultraviolet rays, then there may be limitations to the structure or material of the thin film transistor TFT.

As shown in FIG. 7C, the substrate FB to which ultraviolet light has been projected using the projection optical system LE is such that a region (SAM) on which the surface modification layer (SAM) is coated and a sublimated region (N-SAM) are formed. As shown in FIG. 7A, in the A-A cross-section of FIG. 7C, the surface modification layer SAM corresponds to the channel length CH. In the sublimated region (N-SAM), the insulator IS appears on the surface of the substrate FB.

Figure 8A:
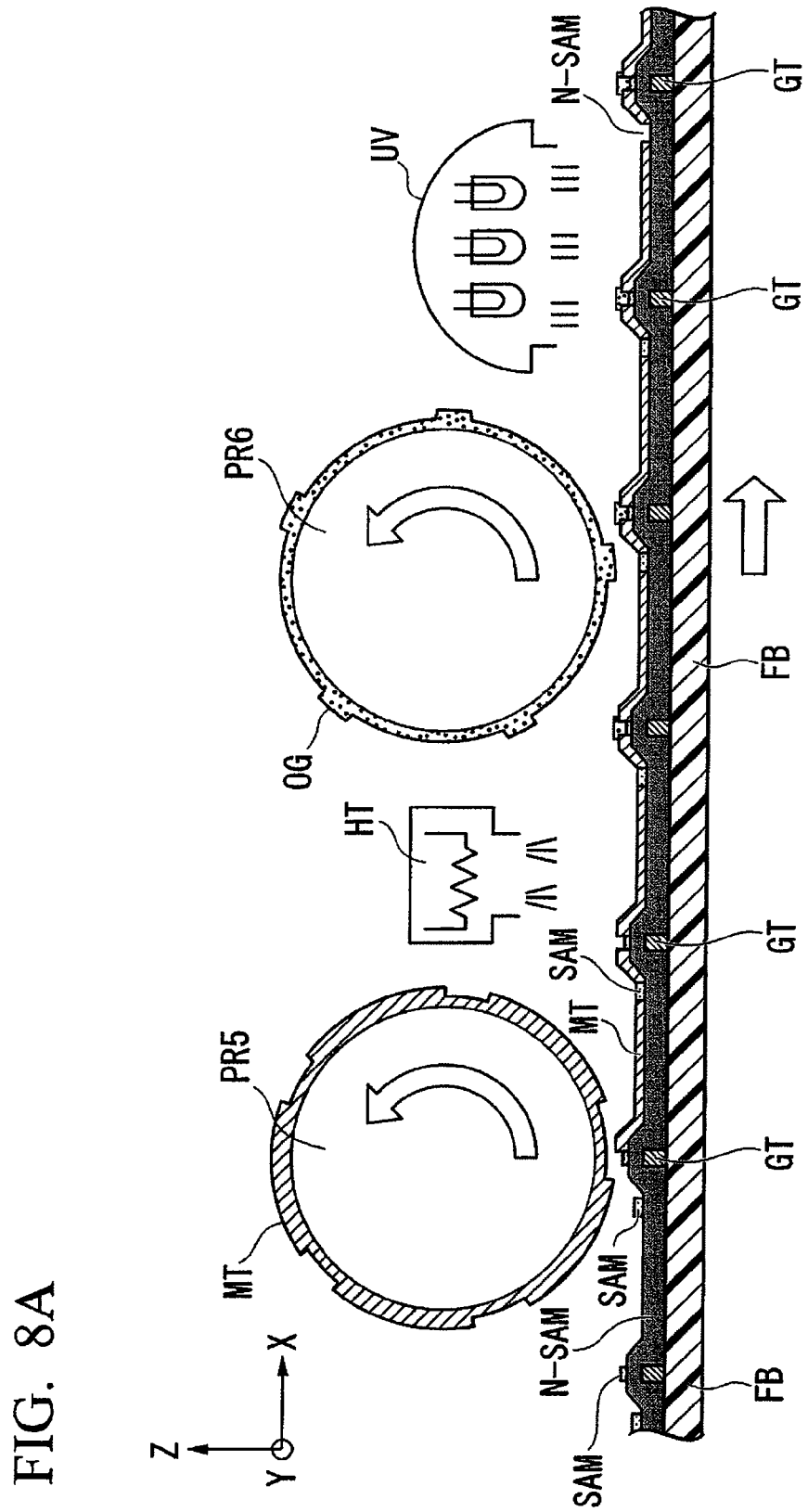
FIG. 8A is a drawing that shows a schematic view in which a process in which an organic semiconductor is formed after a surface modification layer of the channel length is formed and a cross-sectional view of the substrate.
Figure 8B:
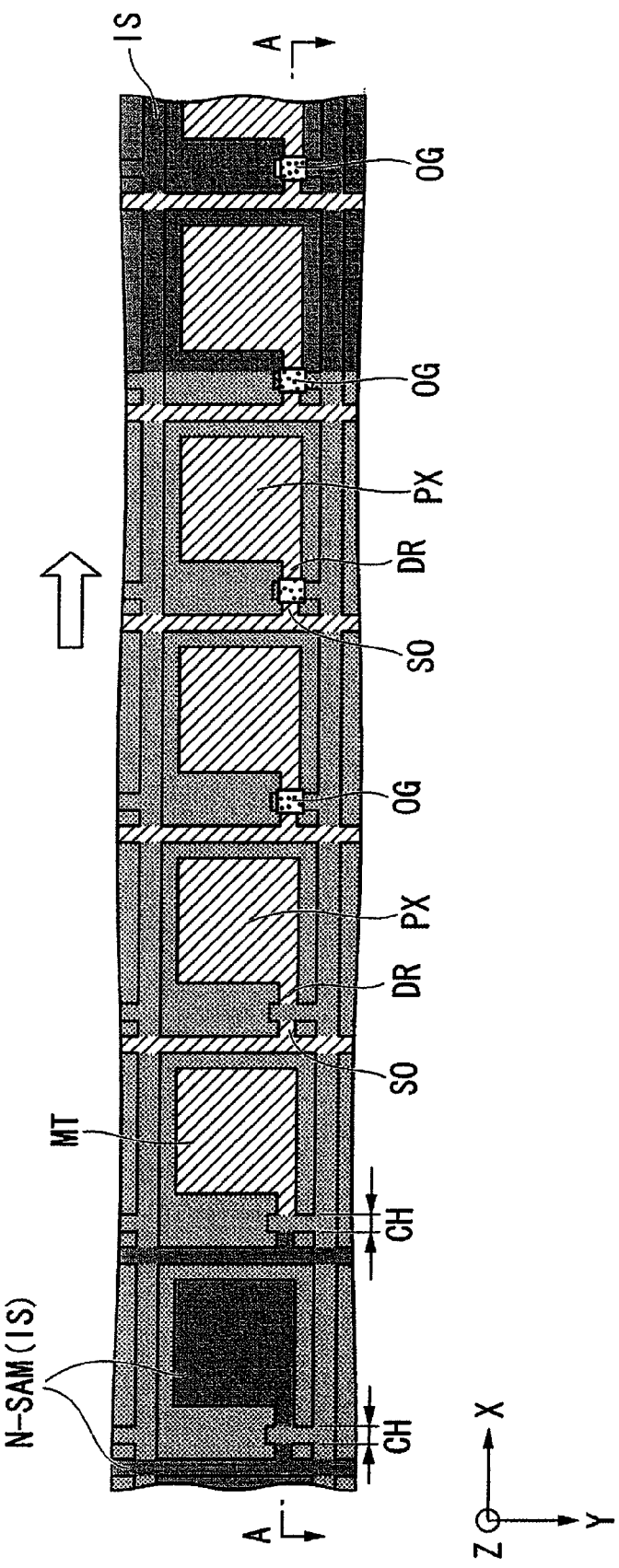
FIG. 8B is a drawing of FIG. 8A as seen from +Z direction.

FIGS. 8A and 8B are a drawing that shows a process in which, after a surface modification layer SAM of the channel length has been formed, an organic semiconductor OG is formed. FIG. 8A is a drawing in which a schematic view of the respective processes and a cross-sectional view of the substrate FB are drawn in a stacked manner, and FIG. 8B is a top view of the substrate FB of the respective processes. The A-A cross-section of FIG. 8B is a cross-sectional view of the substrate FB of FIG. 8A. Note that a solid line that indicates the position of the gate electrode is drawn in order to facilitate understanding of FIG. 8B.

As shown at the leftmost side of FIGS. 8A and 8B, there is a region (SAM) in which, by means of exposure, the surface modification layer SAM has been coated to the substrate FB and a region (N-SAM (IS)) in which the insulator IS has appeared. A printing roller PR5 (a coating part) in which the fluid electrode material MT has been soaked rotates with respect to this substrate FB, and a layer of the fluid electrode material MT is formed on the substrate FB. The fluid electrode material MT may also be coated by the droplet spraying method or the mist deposition method, etc. The fluid electrode material MT is not coated to the region (SAM) to which the surface modification layer SAM is coated, and the fluid electrode material MT is coated to the region (N-SAM (IS)) in which the insulator IS has appeared. The coated fluid electrode material MT is dried and baked using the hot air heater HT, etc.

When the fluid electrode material MT is baked by means of the hot air heater HT, etc., the source electrode SO, the drain electrode DR and the pixel electrode PX are formed. A surface modification layer SAM of the channel length CH is formed by means of the exposure apparatus EX as discussed above, so the channel length CH between the source electrode SO and the drain electrode DR is accurately formed.

Next, by means of a printing roller PR6 (a coating part) into which a fluid organic semiconductor OG has been soaked rotating, a layer of the organic semiconductor OG is formed on the substrate FB. The organic semiconductor OG may also be coated by an inkjet system droplet spraying method that uses piezoelectricity. A derivative that includes a substitution group of pentacene or tetracene, which are precursors, may also be used as the organic semiconductor OG. In addition, polythiophenes, aromatic oligomers such as oligothiophene, a copolymer (F8T2) of fluorene and bithiophene, etc. may also be used as the organic semiconductor OG. In addition, a macromolecular material (poly-3-hexylthiophene (P3HT)) may also be used as the organic semiconductor OG. Note that, pentacene, etc., which are low molecular materials, tend not to dissolve in solvents and are coated to the substrate FB in the pentacene precursor status. The pentacene precursor is such that orientation of the pentacene improves by means of the surface modification layer SAM to improve switching performance of the element.

As shown at the rightmost side of FIG. 8A, the ultraviolet ray light source UV irradiates ultraviolet light to the surface modification layer SAM. Through this, the remaining surface modification layer SAM is completely sublimated, and when the substrate FB is viewed from the upper surface (FIG. 8B), the insulator IS layer can be checked. In addition, by means of ultraviolet light being irradiated to a fluid organic semiconductor OG, the functions of the organic semiconductor OG are activated. That is, the ultraviolet light converts the pentacene precursor, which is an organic semiconductor OG, to pentacene.

Figure 9A:
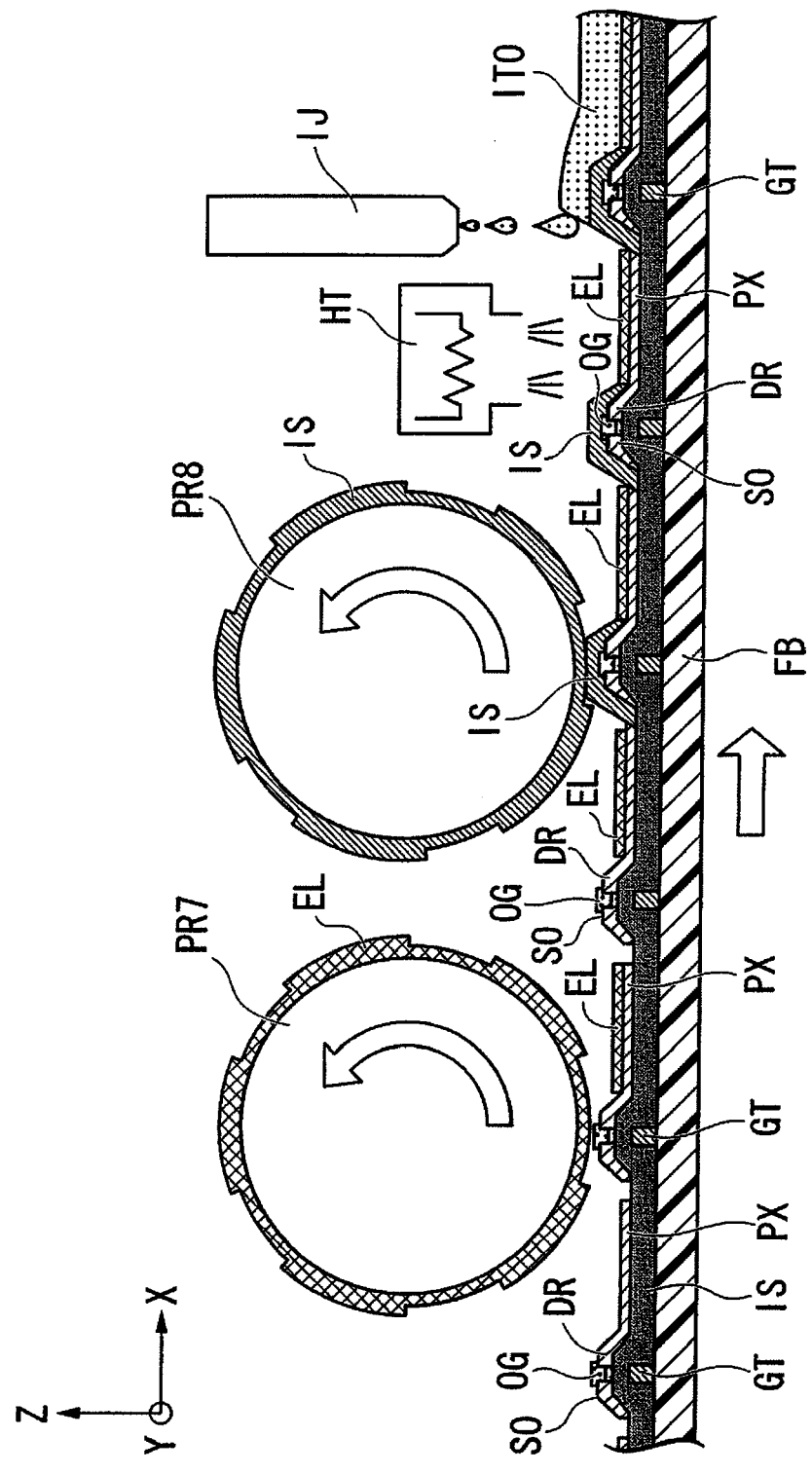
FIG. 9A is a drawing that shows a schematic view in which a process in which a transparent electrode is formed after the organic semiconductor is formed and a cross-sectional view of the substrate.
Figure 9B:
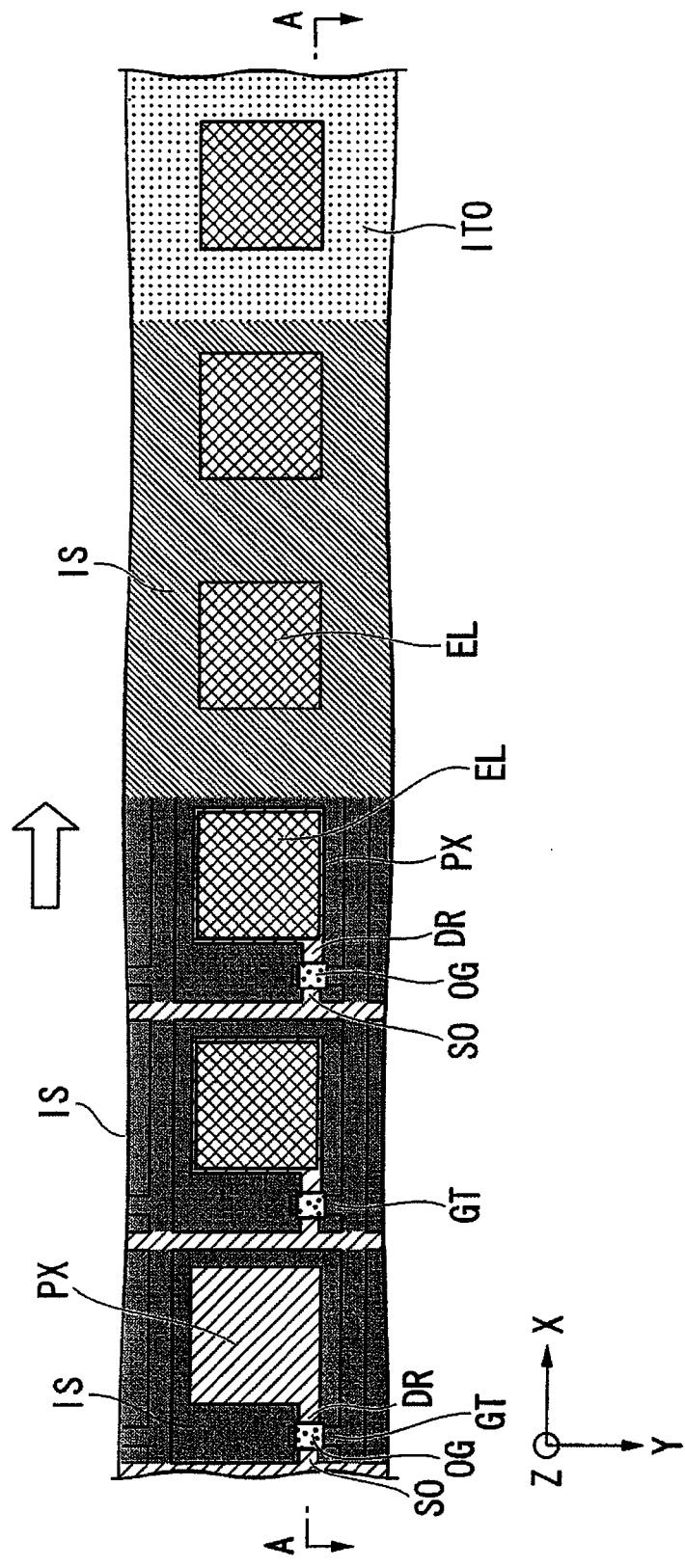
FIG. 9B is a drawing of FIG. 9A as seen from +Z direction.

FIGS. 9A and 9B are a drawing that shows a process in which a transparent electrode ITO is formed after an organic semiconductor OG is formed. FIG. 9A is a schematic view of the respective processes and also shows a cross-section of the substrate FB, and FIG. 9B is a top view of the substrate FB of the respective processes. The A-A cross-section of FIG. 9B is a cross-sectional view of the substrate FB of FIG. 9A. Note that a solid line that shows the position of the gate electrode is drawn at a part in order to facilitate understanding of FIG. 9B.

As shown at the leftmost side of FIGS. 9A and 9B, the pixel electrode PX is formed at the surface of the substrate FB. A printing roller PR7 (a coating part) into which a phosphorescent compound has been soaked rotates with respect to this pixel electrode PX, and a phosphorescent compound EL layer is formed on the pixel electrode PX. The phosphorescent compound EL may also be coated by the droplet spraying method, etc. in addition to the printing method. Note that, if it is a white organic EL element, the phosphorescent compound EL is such that a white dopant material is added, and if it is a color organic EL element, red, blue and green dopant materials are added. These are coated to the appropriate (preset) pixel electrode PX.

Next, by means of a printing roller PR8 (a coating part), into which the insulator IS has been soaked, rotating, a layer of the insulator IS is formed on the source electrode SO, the drain electrode DR and the organic semiconductor OG. The insulator IS is coated to the pixel electrode PX, that is, regions other than the phosphorescent compound EL. The insulator IS may also be coated by the droplet spraying method, etc. in addition to the printing method. This insulator IS is dried using, for example, the hot air heater HT.

As shown at the rightmost side of FIGS. 9A and 9B, the transparent electrode ITO is formed on the insulator IS layer and the phosphorescent compound EL region by means of an inkjet IJ, etc. In the above way, an organic EL element that uses a thin transistor TFT is formed.

About the Exposure Apparatus

Figure 10:
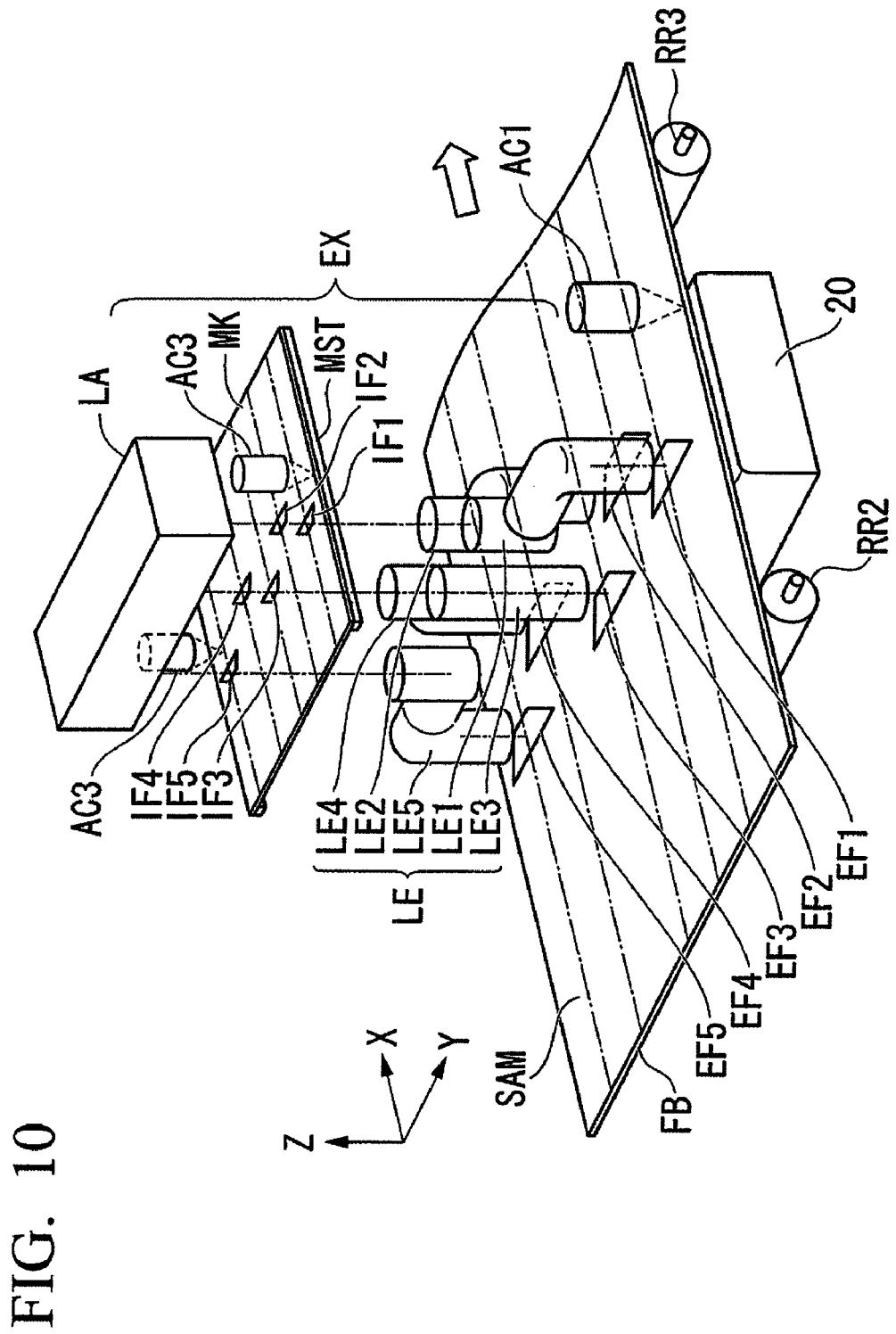
FIG. 10 is an oblique view of an exposure apparatus that exposes a surface modification layer using the gate electrode mask and the source electrode and drain electrode mask.
Figure 11:
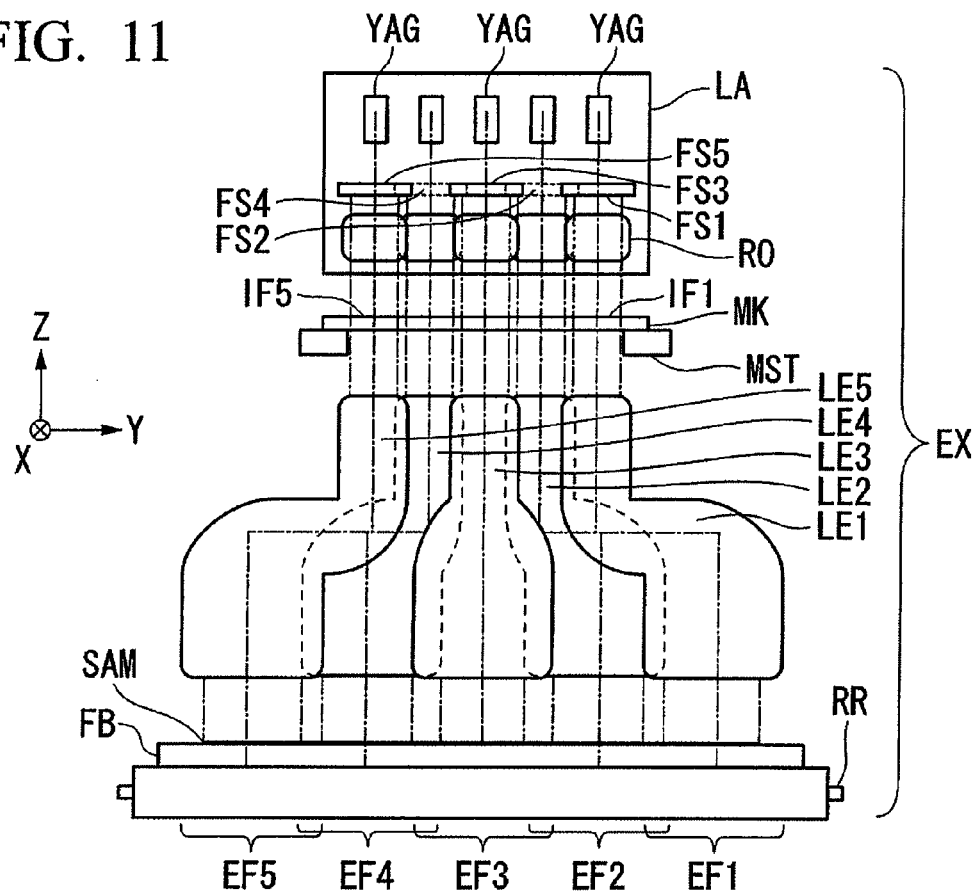
FIG. 11 is a front view of the exposure apparatus in FIG. 10 as seen from the −X direction.

FIG. 10 is an oblique view of an exposure apparatus EX that exposes a surface modification layer SAM using the gate electrode mask MK1 and the source electrode and drain electrode mask MK2 (hereunder, both are referred to as the mask MK). In addition, FIG. 11A is a front view of the exposure apparatus EX in FIG. 10 as seen from the X direction. In FIG. 10 and FIG. 11, a description will be given with the vertical directions of the substrate FB as the Z axis, the transport direction of the substrate FB as, the X axis, and the non-transport direction orthogonal to the X axis as the Y axis.

In FIG. 10 and FIG. 11, the exposure apparatus EX comprises an illumination apparatus LA, which illuminates a pattern PA-A (see FIG. 12) of the mask MK with illumination light from an illumination light source YAG, a mask stage MST, which holds and moves the mask MK, and a projection optical system LE, which projects an enlarged image of the pattern of the mask MK onto the substrate PT. In addition, the exposure apparatus EX comprises a planar holding stage 20, which holds the substrate FB, a moving roller RR (RR2, RR3), and a drive mechanism (not shown), which drives the mask stage MST and the moving roller RR. The illumination apparatus LA, the mask stage MST and the base material (not shown) of the moving roller RR as well as the projection optical system LE, etc. are supported by a frame mechanism that is not shown. In addition, in order to position the position of the pattern of the mask MK and the position of the substrate FB, a pair of substrate alignment cameras AC1 are arranged at the upper part (+Z side) of the vicinity of both ends of the substrate FB in the Y directions, and a mask alignment camera AC3 is arranged at the upper part (+Z side) of the vicinity of both ends of the mask MK in the Y directions.

The substrate FB shown in FIG. 10 and FIG. 11 is a resin film of, for example, a width of 2.2 m and a length of 200 m, and a surface modification layer SAM is formed according to the method described in FIG. 6. In the illumination apparatus LA of FIG. 10 and FIG. 11, five light beams of ultraviolet light that have been emitted from the illumination light source YAG are respectively incident to five illumination optical systems (not shown) that partially illuminate the mask MK. Pulse light comprising a 3× high frequency wave (wavelength of 355 nm) of a YAG laser is used as the ultraviolet light.

The emitted ultraviolet light respectively illuminates five field stops FS1, FS2, FS3, FS4, FS5 (see FIG. 11) via a collimator lens and a fly-eye lens that are not shown. Field stops FS1, FS3 and FS5 are arranged in a row in the Y axis directions. Field stops FS2 and FS4 are arranged in a row in the Y axis directions separated by a prescribed distance from the field stops FS, etc. in the X axis directions. The light beams from field stops FS1~FS5 nearly uniformly illuminate trapezoidal (a trapezoidal shape in which the two sides of the Y directions are parallel or tilted with respect to the X axis directions) illumination regions IF1, IF2, IF3, IF4 and IF5, which have two sides parallel to the X axis directions on the mask MK, via a relay optical system RO. Illumination regions IF1, IF3 and IF5 are arranged in a row in the Y axis directions. Illumination regions IF2 and IF4 are arranged in a row in the Y axis directions at a prescribed distance from illumination regions IF1, etc. in the X axis directions. Note that, in FIG. 10 and FIG. 11, five field stops FS1~FS5 are drawn, but the apertures for the five field stops may also be formed on one member as a common field stop member. In addition, the apertures of the five field stops FS1~FS5 have a trapezoidal shape, but they may also be of a hexagonal shape.

The light from illumination regions IF1~IF5 of the mask MK exposes exposure regions EF1, EF2, EF3, EF4 and EF on the substrate FB via the respectively corresponding first, second, third, fourth and fifth projection optical systems LE1, LE2, LE3, LE4 and LE5. Projection optical systems LE1~LE5 are respectively telecentric at the mask MK side and the substrate FB side and have an enlargement magnification from the mask MK side to the substrate FB side. The shapes of exposure regions EF1~EF5 are shapes in which the shapes of illumination regions IF1~IF5 are enlarged at the projection magnification of projection optical systems LE1~LE5. In addition, projection optical systems LE1~LE5 invert the image, so the shapes of exposure regions EF1~EF5 become inverted images of the shapes of illumination regions IF1~IF5.

Projection optical systems LE1, LE3 and LE5 are arranged in a row in the Y axis directions. Projection optical systems LE2 and LE4 are arranged in a row in the Y axis directions at a prescribed distance from projection optical systems LE1, etc. in the X axis directions. Exposure regions EF1, EF3 and EF5, which correspond to projection optical systems LE1, LE3 and LE5, are also arranged in a row in the Y axis directions, and exposure regions EF2 and EF4, which correspond to projection optical systems LE2 and LE4, are also arranged in a row in the Y axis directions at a prescribed distance in the X axis directions. Note that the shapes of exposure regions EF1~EF5 are set by means of the field stops FS shielding a part of the illumination light.

In the present embodiment, the projection optical system LE is comprised including those five projection optical systems LE1~LE5. The respective projection optical systems LE1~LE5 form an enlarged projected image, which has respectively enlarged pattern PA-A (FIG. 12) within illumination regions IF1~IF5 on the mask MK at a common enlargement magnification, on exposure regions EF1~EF5 on the surface modification layer SAM. It is preferable that the enlargement magnification M of projection optical systems LE1~LE5 be two times or more, and, in the present embodiment, an enlargement magnification of two times is employed. For this reason, as shown in FIG. 11, the lens barrel of the image side (emergence side) of projection optical systems LE1 and LE2 shifts the projection axis in the +Y axis direction by a projection magnification M centering on (starting on) projection optical system LE3. In addition, the lens barrel of the image side of projection optical systems LE4 and LE5 shifts the projection axis in the −Y axis direction by projection magnification M.

The mask stage MST and the moving roller RR move the mask MK and the substrate FB via a drive mechanism (not shown). The positional relationship of the mask MK and the substrate FB are measured by means of the substrate alignment camera AC1 and the mask alignment camera AC3, and the mask MK is adjusted to a position aligned with the substrate FB by means of the mask stage MST. During exposure, in synchronization that the mask stage MST is driven at a velocity V/M (M is the enlargement magnification) in the X axis directions, the substrate FB is driven at a velocity V in the X axis directions. The images of projection optical systems LE1~LE5 are inverted images in the X axis directions, so the movement direction of the mask stage MST and the movement direction of the substrate FB become reversed in the X axis.

Figure 12:
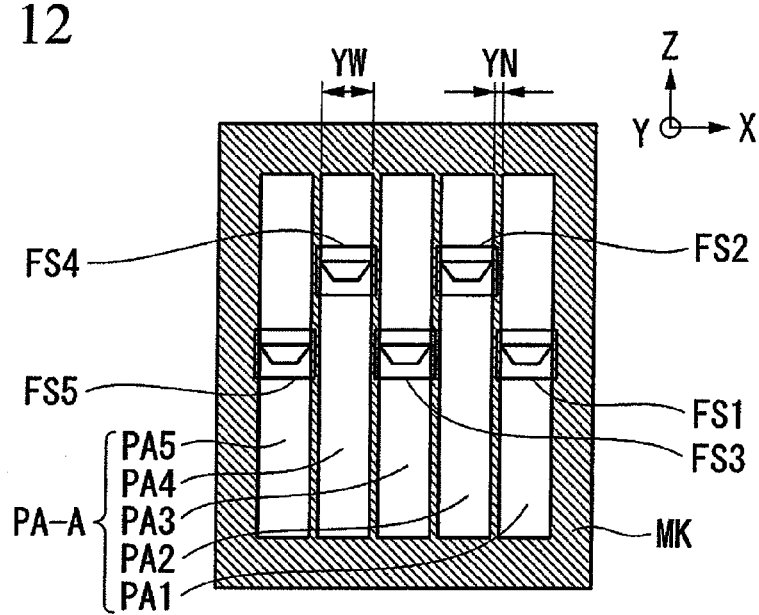
FIG. 12 is a drawing of field stops and the mask as seen from the illumination apparatus side.
Figure 13:
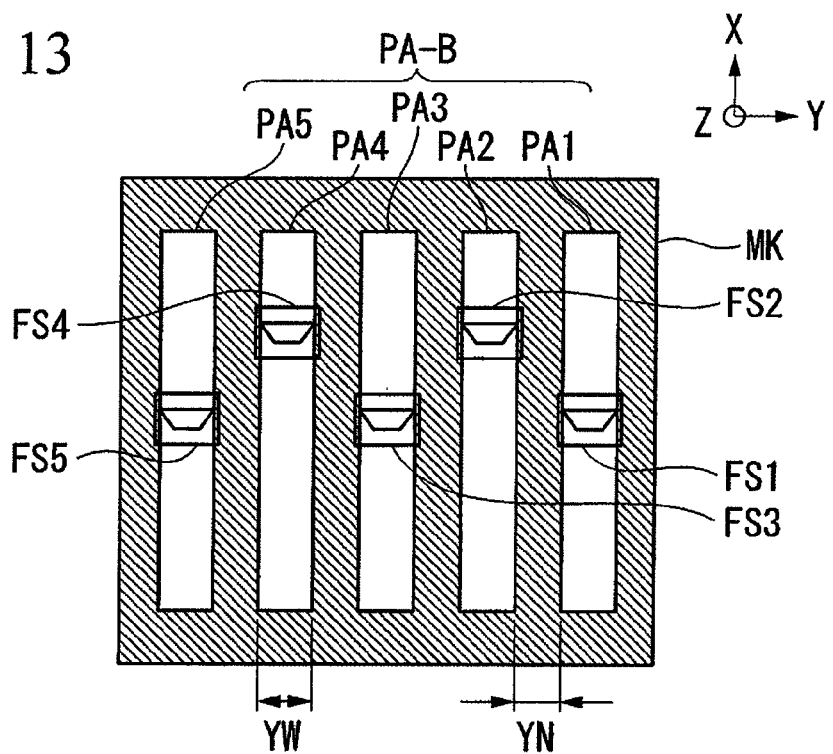
FIG. 13 is a drawing of field stops and the mask as seen from the illumination apparatus side.
Figure 14:
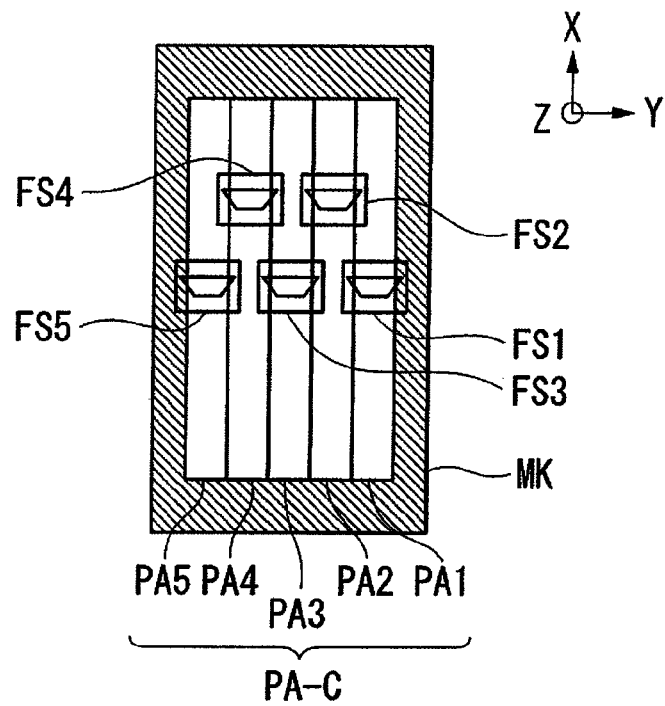
FIG. 14 is a drawing of field stops and the mask as seen from the illumination apparatus side.

From FIG. 12 through FIG. 14 are drawings of field stops FS1~FS5 and the mask MK as seen from the illumination apparatus LA side. FIG. 12 is pattern PA-A of the mask MK used by the exposure apparatus EX shown in FIG. 10 and FIG. 11. FIG. 13 is a drawing that shows another pattern, which is PA-B. In addition, FIG. 14 is a drawing that shows yet another pattern, which is PA-C.

Pattern PA-A of FIG. 12 has five pattern regions, which are PA1, PA2, PA3, PA4 and PA5, corresponding to five fields stops, which are FS1, FS2, FS3, FS4 and FS5. These pattern regions PA1~PA5 are arranged so that their sides are close together through (interposing) light shielding regions, and the widths YN of those light shielding regions are narrower than the widths YW of the individual pattern regions PA1~PA5. The projection optical systems LE1~LE5 of the present embodiment are such that the magnification ratios are double, so when the projection axis does not shift in the Y axis directions, exposure regions EF1 and EF2 on the substrate FB resulting from pattern regions PA1 and PA2 unfortunately become largely superposed. The same is true for the regions of the other adjacent pattern regions PA3, PA4 and PA5. For this reason, as shown in FIG. 10 and FIG. 11, centering on projection optical system LE3, the image sides of projection optical systems LE1 and LE2 are such that the projection axis shifts in the +Y axis direction, and the image sides of projection optical systems LE4 and LE5 are such that the projection axis shifts in the −Y axis direction.

Pattern PA-B of FIG. 13 has five pattern regions, which are PA1, PA2, PA3, PA4 and PA5, corresponding to five fields stops, which are FS1, FS2, FS3, FS4 and FS5. These pattern regions PA1~PA5 are arranged to be separated by the same light shielding width YW as the widths YW of the pattern regions. When the magnification ratios of the projection optical systems are double, exposure regions EF1 and EF2 on the substrate FB just come into contact by means of pattern regions PA1 and PA2. Therefore, on the mask MK, if pattern regions PA1~PA5 are formed at the interval of the adjacent pattern regions corresponding to the magnification ratio of the projection optical systems, it is not necessary for the projection optical systems to shift the projection axes in the Y axis directions.

Pattern PA-C of FIG. 14 has five pattern regions, which are PA1, PA2, PA3, PA4 and PA5, corresponding to five fields stops, which are FS1, FS2, FS3, FS4 and FS5. These pattern regions PA1~PA5 are one pattern region, and light shielding widths YW are not provided. In this way, in the case in which light shielding widths YW are not provided in one pattern PA-C in this way, the shapes of exposure regions EF1~EF5 must be made erect images. Therefore, in the case in which the mask MK of pattern PA-C is used, the exposure apparatus EX is such that projection optical systems LE1~LE5, which project erect images, are arranged.

Note that the aforementioned embodiments were premised upon the substrate FB being a roll-type resin sheet, so the moving roller RR and the planar holding stage 20 were used. However, for resin sheets or glass substrates, etc. of a prescribed size, an XY stage that moves in the XY plane may be arranged instead of the moving roller RR and the planar holding stage 20.

According to the display element manufacturing method in the above-mentioned embodiment, it is possible to manufacture elements using mass production by laminating the first surface modification layer onto the substrate without a process that peels a resist such those up to the present.

The display element manufacturing apparatus in the above-mentioned embodiment forms a surface modification layer on a substrate, uses a mask on which a pattern has been formed, and projects light that includes ultraviolet rays to the surface modification layer via a projection optical system. Through this, it is possible to perform exposure accurately and with fine precision.

The circuit forming apparatus in the above-mentioned embodiment comprises substrate retaining apparatuses that slacken the flexible substrate, so it is possible to accurately form the pattern of the mask without strictly controlling the synchronization velocity, etc. with other processes when exposing the mask pattern to a flexible substrate transported in the prescribed direction.

According to the thin film transistor manufacturing method in the above-mentioned embodiment, it is possible to manufacture thin film transistors that have high mass production capability by sequentially laminating an insulating layer, a first surface modification layer and a fluid electrode material onto a substrate without a process such as one that peels a resist such as those up to this point. In addition, a mask and a projection optical system are used to form the source electrode and the drain electrode, so it is possible to accurately manufacture the interval between the source electrode and the drain electrode, which determines the response speed of the thin film transistor.

The thin film transistor manufacturing apparatus in the above-mentioned embodiment forms a surface modification layer on a substrate and uses a mask on which the patterns of the source electrode and the drain electrode have been drawn and transfers light that includes ultraviolet rays to the surface modification layer via the projection optical system. Through this, it is possible to discriminate regions that will repel and regions that will not repel the fluid electrode material accurately and with fine precision, and it is possible to form the source electrode and the drain electrode accurately.

The display element manufacturing method in the above-mentioned embodiment is able to form a pattern on a surface modification layer by means of exposure that uses a projection optical system.

The thin film transistor manufacturing method in the above-mentioned embodiment is able to shorten the channel length between the source electrode and the drain electrode by means of exposure that uses a projection optical system. In addition, even if the difference between the high regions and the low regions on the substrate become large in wet processes such as printing and coating, at least the image plane side of the projection optical system is telecentric, so it is possible to form a pattern with good accuracy.

What is claimed is:

1. A display element manufacturing method; comprising:
    transporting a flexible sheet substrate along a predetermined transport route by a transport apparatus;
    performing a first process that forms a first electrode for thin film transistors arranged corresponding to respective pixels in the display element, the first process including:
    forming a first surface modification layer having a repelling property with respect to a fluid material on the sheet substrate by using a first coating or printing apparatus;
    irradiating ultraviolet rays having a shape corresponding to the first electrode onto the first surface modification layer so as to modify a region corresponding to the first electrode from having the repelling property to having a non-repelling property by using a first exposure apparatus; and
    causing a first fluid material for the first electrode to be selectively disposed at the region having the non-repelling property on the sheet substrate by using a second coating or printing apparatus;
    performing a second process that applies a fluid material so as to form an insulating layer for the thin film transistors on the sheet substrate where the first electrode is formed; and
    performing a third process that forms a second electrode for the thin film transistors, the third process including:
    forming a second surface modification layer having a repelling property with respect to a fluid material on the sheet substrate where the insulating layer is formed by using a third coating or printing apparatus;
    irradiating ultraviolet rays having a shape corresponding to the second electrode onto the second surface modification layer so as to modify a region corresponding to the second electrode from having the repelling property to having a non-repelling property by using a second exposure apparatus; and
    causing a second fluid material for the second electrode to be selectively disposed at the region having the non-repelling property on the sheet substrate by using a fourth coating or printing apparatus.

2. The display element manufacturing method according to claim 1, wherein
    the second exposure apparatus has a projection optical system that projects the ultraviolet rays having a shape corresponding to the second electrode and is double telecentric.

3. The display element manufacturing method according to claim 1, wherein
    the first exposure apparatus projects ultraviolet rays defined by a first mask pattern having a shape corresponding to the first electrode via a projection optical system having a specific projection magnification on the sheet substrate; and
    the second exposure apparatus projects ultraviolet rays defined by a second mask pattern having a shape corresponding to the second electrode via the projection optical system where the specific projection magnification is adjustable on the sheet substrate.

4. The display element manufacturing method according to claim 3, wherein
    the first and second exposure apparatuses are configured to perform a scan exposure of the first mask pattern and the second mask pattern respectively on the sheet substrate while transporting the sheet substrate at predetermined velocities; and
    the projection optical systems of the first and second exposure apparatuses are configured to be double telecentric.

5. The display element manufacturing method according to claim 1, wherein
    the first surface modification layer and the second surface modification layer are self-assembled monolayers having the repelling property with respect to the first and second fluid materials disposed thereon.

6. The display element manufacturing method according to claim 1, wherein:
    the first electrode formed in the first process is a gate electrode of the thin film transistors;
    the first exposure apparatus projects ultraviolet rays defined by a first mask pattern having a shape corresponding to the gate electrode on the sheet substrate;
    the second electrode formed in the third process is a source electrode and a drain electrode of the thin film transistors; and
    the second exposure apparatus projects ultraviolet rays defined by a second mask pattern having shapes corresponding to the source electrode and the drain electrode on the sheet substrate.

7. The display element manufacturing method according to claim 6, further comprising:
    performing a fourth process that selectively applies a third fluid material for a semiconductor layer between the source electrode and the drain electrode formed in the third process by using a fifth coating or printing apparatus.

8. The display element manufacturing method according to claim 6, further comprising:

performing a fifth process that dries the first fluid material disposed on the sheet substrate in the first process and modifies a remaining region having the repelling property of the first surface modification layer on the sheet substrate to a region having a non-repelling property by irradiating ultraviolet rays, wherein the second process is performed after the fifth process.

9. The display element manufacturing method according to claim 1, wherein the second and fourth coating or printing apparatuses apply the first and second fluid materials on the sheet substrate with one method selected from a group of a printing method, a droplet spraying method, a spin coating method, a dipping method and a mist deposition method.

10. A method of manufacturing a thin film transistor on a substrate, the method comprising:

forming a first surface modification layer having a repelling property with respect to a first fluid material on the substrate by using a first coating or printing apparatus;

irradiating ultraviolet rays having a shape corresponding to a gate electrode of the thin film transistor onto the first surface modification layer so as to modify a region corresponding to the gate electrode from having the repelling property to having a non-repelling property by using a first exposure apparatus;

causing the first fluid material for the gate electrode to be selectively disposed on the region having the non-repelling property on the substrate by using a second coating or printing apparatus;

applying a second fluid material so as to form an insulating layer of the thin film transistor on the substrate where the gate electrode is formed;

forming a second surface modification layer having a repelling property with respect to a third fluid material on the substrate where the insulating layer is formed by using a third coating or printing apparatus;

irradiating ultraviolet rays having shapes corresponding to a source electrode and a drain electrode of the thin film transistor onto the second surface modification layer so as to modify a region corresponding to the source electrode and the drain electrode from having the repelling property to having a non-repelling property by using a second exposure apparatus;

causing the third fluid material for the source electrode and the drain electrode to be selectively disposed on the region having the non-repelling property on the substrate by using a fourth coating or printing apparatus; and selectively applying a fourth fluid material for semiconductor layer between the source electrode and the drain electrode by using a fifth coating or printing apparatus.

11. A manufacturing apparatus for manufacturing a display element which has a plurality of thin film transistors for pixels, the apparatus comprising:

a transport apparatus that transports a flexible sheet substrate along a predetermined transport route;

a first coating or printing apparatus that forms a first surface modification layer having a repelling property with respect to a first fluid material on the sheet substrate;

a first exposure apparatus that irradiates ultraviolet rays having a shape corresponding to a first electrode of the thin film transistors onto the first surface modification layer so as to modify a region corresponding to the first electrode from having the repelling property to having a non-repelling property;

a second coating or printing apparatus that causes the first fluid material for the first electrode to be selectively disposed on the region having the non-repelling property on the sheet substrate;

an insulating layer coating or printing apparatus that applies a second fluid material for an insulating layer of the thin film transistors on the sheet substrate where the first electrode is formed;

a third coating or printing apparatus that forms a second surface modification layer having a repelling property with respect to a third fluid material on the sheet substrate where the insulating layer is formed;

a second exposure apparatus that irradiates ultraviolet rays having a shape corresponding to a second electrode of the thin film transistors onto the second surface modification layer so as to modify a region corresponding to the second electrode from having the repelling property to having a non-repelling property; and a fourth coating or printing apparatus that causes the third fluid material for the second electrode to be selectively disposed on the region having the non-repelling property on the sheet substrate, wherein the first coating or printing apparatus, the first exposure apparatus, the second coating or printing apparatus, the insulating layer coating or printing apparatus, the third coating or printing apparatus, the second exposure apparatus, and the fourth coating or printing apparatus are arranged in order from an upstream side to a downstream side of the transport route.

12. The manufacturing apparatus according to claim 11, wherein:

the first exposure apparatus includes a first projection optical system that projects ultraviolet rays defined by a first mask pattern having a shape corresponding to the first electrode of the thin film transistors on the sheet substrate;

the second exposure apparatus includes a second projection optical system that projects ultraviolet rays defined by a second mask pattern having a shape corresponding to the second electrode of the thin film transistors on the sheet substrate; and the projection optical system of the second exposure apparatus is double telecentric.

13. The manufacturing apparatus according to claim 12, wherein:

each of the first and second projection optical systems of the first and second exposure apparatuses is such that an image of the mask pattern is projected to the sheet substrate by inverting the pattern while the projected image of the mask pattern is enlarged by more than two magnification of the mask pattern.

14. The manufacturing apparatus according to claim 12, wherein each of the mask patterns has a first pattern region and a second pattern region that is separated from the first pattern via a shielding region, and each of the projection optical systems has a first optical system corresponding to the first pattern region and a second optical system corresponding to the second pattern region.

15. The manufacturing apparatus according to claim 11, wherein the first surface modification layer and the second surface modification layer are self-assembled monolayers having the repelling property with respect to the fluid materials disposed thereon.

16. The manufacturing apparatus according to claim 12, wherein
- the first electrode is a gate electrode of the thin film transistors;
- the first mask pattern has a shape corresponding to the gate electrode;
- the second electrode is a source electrode and a drain electrode of the thin film transistors; and
- the second mask pattern has shapes corresponding to the source electrode and the drain electrode.

17. The manufacturing apparatus according to claim 16, further comprising:
- a fifth coating or printing apparatus that is arranged at a downstream side of the fourth coating or printing apparatus in the transport route and selectively applies a fourth fluid material for a semiconductor layer between the source electrode and the drain electrode formed by the fourth coating or printing apparatus.

* * * * *